Oct. 15, 1957 R. P. CLEMENTS 2,810,025

DIRECT-COUPLED FEEDBACK AMPLIFIER

Filed July 15, 1954

INVENTOR.
RICHARD P. CLEMENTS,
BY
Henry Heyman
ATTORNEY.

United States Patent Office 2,810,025
Patented Oct. 15, 1957

2,810,025

DIRECT-COUPLED FEEDBACK AMPLIFIER

Richard Paul Clements, Inglewood, Calif., assignor to Hughes Aircraft Company, Culver City, Calif., a corporation of Delaware Application July 15, 1954, Serial No. 443,550

4 Claims. (Cl. 179—171)

Figure 1:
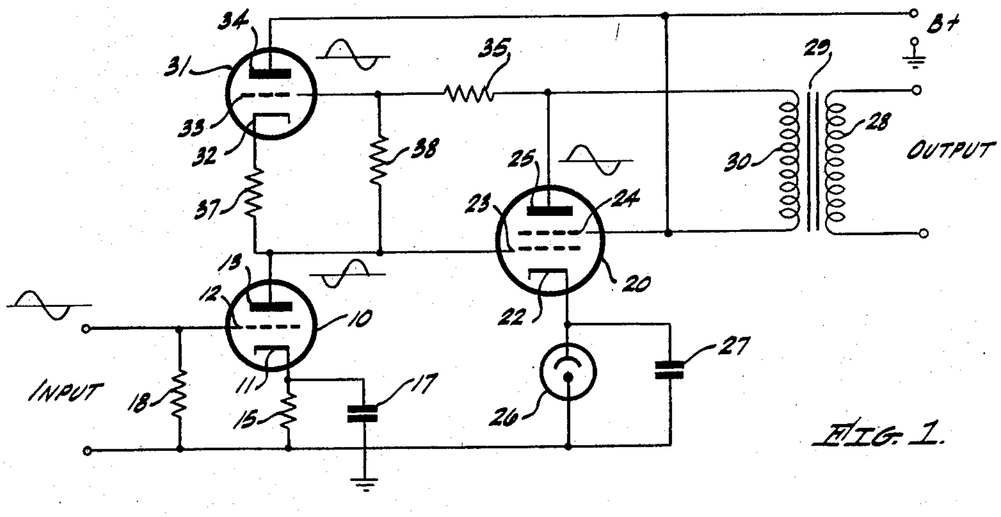

This invention relates to audio frequency amplifier circuits, and more particularly to an improved direct-coupled amplifier utilizing degenerative feedback.

To attain substantially uniform distortionless output from a direct-coupled audio amplifier, a small amount of degenerative feedback is generally introduced. However, reactive impedance effects in the feedback circuit effectively limit the audio frequency range over which desirable results are obtainable. To nullify these effects necessitates the use of additional circuit elements in conjunction with the feedback circuit to offset the loss in amplification at the ends of such range.

A feedback circuit in a direct-coupled amplifier whose impedance is independent of frequency is obtained by the use of elements whose impedances are substantially resistive. A first triode serves as the principal feedback element. The grid voltage of the first triode is controlled by the plate voltage of a beam power tube in the amplifier output circuit. The cathode circuit of the first triode is degeneratively connected to the grid of the beam power tube. By this technique all the advantages of degenerative feedback are realized with a further improvement in that the feedback circuit impedance is substantially independent of frequencies within the audio range.

It is therefore an object of this invention to provide an improved direct-coupled audio frequency amplifier employing a degenerative feedback circuit whose impedance is independent of frequency, thereby uniformly amplifying the voltages at all frequencies within the audio range without the necessity of using additional circuit components not associated with the feedback circuit.

Another object of this invention is to provide an audio frequency amplifier having an improved feedback circuit that effects substantially distortionless amplification over its entire operative frequency range.

Another object of this invention is to provide an improved audio frequency amplifier having a feedback circuit whose impedance is independent of frequency and which may be connected in push-pull to obtain the advantages of this type of circuit.

Figure 2:
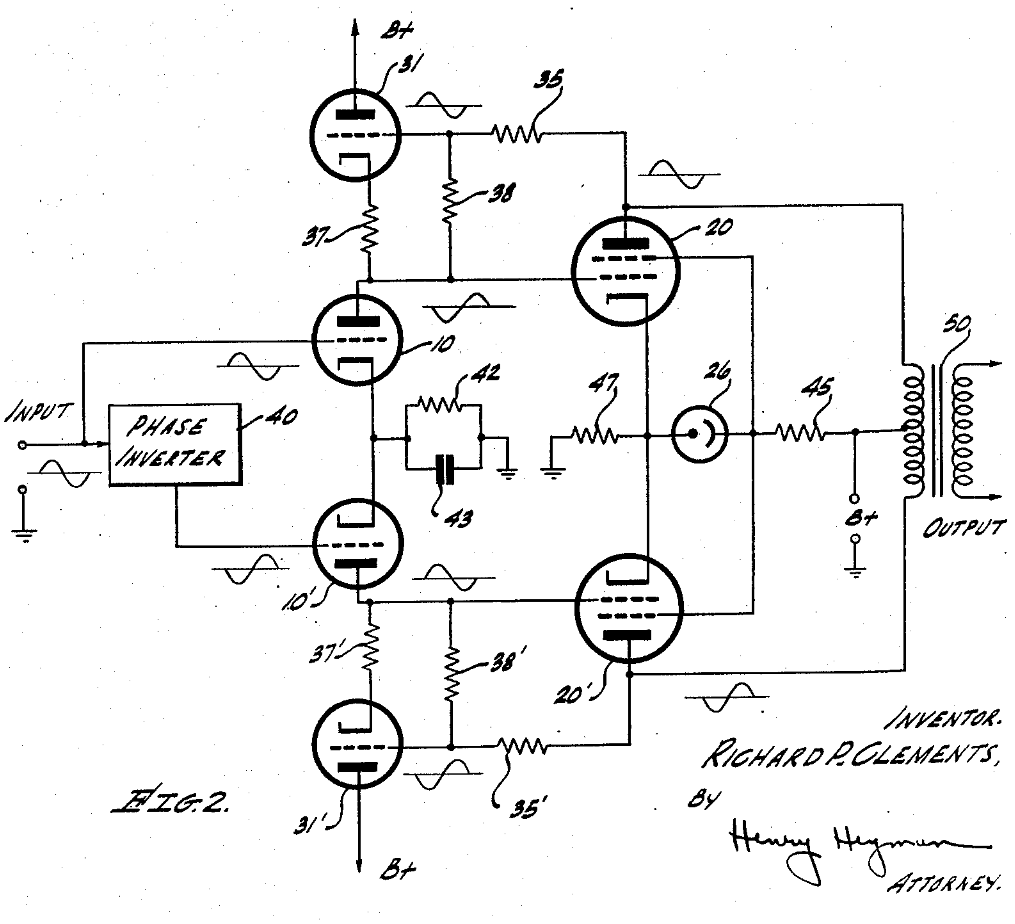

The above enumerated objects and other objects of the invention will become apparent from the following description taken in conjunction with the accompanying drawings made a part of this specification. In the drawings:

Fig. 1 is a schematic diagram of a preferred embodiment of the invention as utilized in a direct-coupled amplifier; and Fig. 2 is a schematic diagram of a push-pull amplifier arrangement embodying the invention.

Referring to Fig. 1, the circuit comprises a conventional direct-coupled amplifier to which has been added an improved feedback circuit whose impedance is independent of audio frequencies. The first stage of amplification comprises a first electron discharge device, such as a triode 10 having a cathode 11, control grid 12, and anode 13, a cathode biasing resistor 15 connected between cathode 11 and ground, a cathode by-pass capacitor 17 also connected between the cathode and ground, and a grid return resistor 18 connected between control grid 12 and ground.

The second stage of amplification includes a second electron discharge device, such as a beam tetrode 20, whose control grid 23 is directly connected to the anode 13 of triode 10. The operating bias of beam tetrode 20 is provided by connecting its cathode 22 to ground through a voltage regulator tube 26 and a by-pass capacitor 27. Its screen grid 24 is brought to the proper operating potential by directly connecting it to the positive terminal B+ of a D.-C. voltage supply source (not shown). The output of the amplifier is developed across the secondary 28 of an output transformer 29 by connecting its primary 30 between anode 25 and screen grid 24 of tetrode 20.

The feed back path comprises a third electron discharge device, such as a triode 31 having a cathode 32, control grid 33, an anode 34, a feedback resistor 35, and a cathode biasing resistor 37. Feedback resistor 35 is connected between anode 25 of tetrode 20 and control grid 33 of triode 31. Cathode biasing resistor 37 is connected between the cathode 32 of triode 31 and the anode 13 of triode 10. A grid return resistor 38 is connected between control grid 33 and anode 13. Anode 34 of triode 31 is directly connected to B+.

The operation of the above-described circuit is as follows: the direct-coupled amplifier functions in the conventional manner. An audio signal appearing across resistor 18 will be amplified and shifted 180° in phase by triode 10. Further amplification and another 180° phase shift is obtained by the action of beam tetrode 20. The voltage swing on control grid 33 of triode 31 is thus 180° out of phase with the signal on the control grid 23 of beam tetrode 20. The voltage across degenerative cathode resistor 37 follows this swing. This feedback voltage will be 180° out-of-phase with respect to the signal voltage appearing at control grid 23, thereby reducing distortion in the output voltage across transformer 30.

In one practical embodiment of the circuit shown in Fig. 1, a flat frequency response was obtained which extended from 5 cycles to well beyond the audio range. Further, it was found that the phase shift through the amplifier and feedback path was substantially negligible throughout the entire audio range.

By placing feedback tube 31 in the plate circuit of tube 10, it functions independently of tube 10. In other words, the feedback circuit is effectively isolated from tube 10, thereby allowing the input stage of the amplifier to operate at maximum efficiency, and yet allowing the benefits of degenerative feedback to occur in the grid circuit of tube 20.

Fig. 2 shows a push-pull arrangement of the circuit in Fig. 1.

Triodes 10, 10′ serve as the input stage of the amplifier. The input signal is applied directly to the control grid of one triode 10 and through a phase inverter 40 to the control grid of the other triode 10′. A cathode biasing resistor 42 is connected between the cathodes of triodes 10, 10′ and ground. A by-pass capacitor 43 is also connected between said cathodes and ground. The plates of triodes 10, 10′ are directly coupled to the control grids of respective beam tetrodes 20, 20′. The screen grids of beam tetrodes 20, 20′ are serially connected through a screen dropping resistor 45 to B+. Biasing resistor 47 is connected between the cathodes of beam tetrodes 20, 20′ and ground. Voltage regulator tube 26 is connected between the screen grids and the cathodes of beam tetrodes 20, 20′. The output voltage of the amplifier is developed across a transformer 50 having its primary connected across the plates of beam tetrodes 20, the primary further being center tapped and the center tap connected to B+. The principal feedback element for each half of the push-pull arrangement comprises triodes 31, 31'. Feedback resistors 35, 35' are connected between the anodes of tetrodes 20, 20' and the control grids of triodes 31, 31'. Cathode biasing resistors 37, 37' are connected between the cathode of triodes 31, 31' and the control grids of tetrodes 20, 20'. Grid return resistors 38, 38' are connected between the control grids of triodes 31, 31' and the control grids of tetrodes 20, 20'.

The circuit just described operates in the conventional manner of push-pull circuits to give a high power output per tube under conditions that otherwise would cause excessive distortion, and eliminating the necessity of employing a bypass capacitor across the cathode biasing resistor of tetrodes 20. Feedback is provided for in the same manner as described in the operation of the circuit shown in Fig. 1. The output voltages on the anodes of tetrodes 20, 20' are utilized to control the bias voltages of triodes 31, 31' by means of resistors 35, 35', 38, 38'. The resultant voltage swing across degenerative cathode resistors 37, 37' follows the output voltage swing of tetrodes 20, 20'. This voltage swing is coupled to the control grids of tetrodes 20, 20', and is 180° out-of-phase with the signal voltage appearing thereon. The improved output of the amplifier is taken off the secondary of transformer 50.

Coupling the screen grids of beam tetrode 20 through resistor 45 to voltage regulator tube 26 fixes the voltage on the screens, thereby making the tetrodes nearly constant current tubes. This allows the voltage on the plate to have a greater swing, thereby providing more feedback voltage with increased power output.

What is claimed as new is:

1. An electrical circuit comprising a positive voltage source, a first tube including a cathode, an anode, and grid electrodes, a first resistor, said first resistor being connected between said grid and ground, a second resistor, said second resistor being connected between said cathode and ground to provide self-bias for said first tube, a first by-pass condenser, said first by-pass condenser being connected between said cathode and ground, a second electron tube including a cathode, control grid, screen grid and anode electrodes, said control grid being connected to the anode of said first tube, a voltage regulator tube, said voltage regulator tube being connected between the cathode of said second tube and ground to provide the proper bias for said second tube, a second by-pass condenser, said second by-pass condenser also being connected between said cathode and ground, an output transformer, the primary of said transformer being connected between the anode and the screen grid of said second tube, said screen grid further being connected to said positive voltage, a third tube having at least an anode, a cathode, and control grid, a third resistor, said third resistor being connected between said control grid and the anode of said second tube, a fourth resistor, said fourth resistor being connected between the control grid of said third tube and the control grid of said second tube, a fifth resistor, said fifth resistor being connected between the cathode of said third tube and the anode of said first tube, said fifth resistor control grid and third resistor being the feedback path between the anode and the control grid of said second tube, whereby said circuit provides a direct coupled feedback amplifier having a substantially distortionless flat frequency response over the entire audio range.

2. An audio frequency amplifier network comprising a first amplifier having at least an anode, cathode and control grid, input signals to said network being provided across the control grid and cathode of said amplifier, a second amplifier having at least an anode, a cathode, screen grid and control grid, the control grid of said second amplifier being directly connected to the anode of said first amplifier, an output circuit coupled to the anode and screen grid of said second amplifier, an electron discharge device having at least an anode, cathode and control grid, a first resistor coupling the anode of said second amplifier to the control grid of said electron discharge device, and a second resistor coupling the cathode of said electron discharge device to the anode of said first amplifier and to the control grid of said second amplifier.

3. An audio frequency amplifier network comprising: a first amplifier having at least an anode, cathode and control grid and responsive to input signals provided to said network; a second amplifier having at least an anode, cathode, screen grid and control grid, the control grid of said second amplifier being directly connected to the anode of said first amplifier; voltage regulating means coupled to the cathode of said second amplifier; output transformer means coupled to the anode and screen grid of said second amplifier, an electron discharge device including at least an anode, cathode and control grid; a first resistor coupling the anode of said second amplifier to the control grid of said electron discharge device; a second resistor coupling the cathode of said electron discharge device to the anode of said first amplifier and the control grid of said second amplifier.

4. An audio frequency amplifier network comprising: a first amplifier having at least an anode, cathode and control grid, input signals to said network being provided across the control grid and cathode of said amplifier; a second amplifier having at least an anode, screen grid, control grid and cathode, the control grid of said second amplifier being directly connected to the anode of said first amplifier; an output circuit connected across the anode and screen grid of said second amplifier; voltage regulating means coupled to the cathode of said second amplifier; an electron discharge device including at least an anode, cathode and control electrode; a first resistor coupling the anode of said second amplifier to the control grid of said electron discharge device; and a second resistor coupling the cathode of said electron discharge device to the anode of said first amplifier and the control grid of said second amplifier, whereby said first resistor, said electron discharge device and said second resistor form a degenerative feedback circuit providing a feedback voltage to the input of said second amplifier.

References Cited in the file of this patent

UNITED STATES PATENTS

| | | |
|---|---|---|
| 2,106,342 | Doba | Jan. 25, 1938 |

FOREIGN PATENTS

| | | |
|---|---|---|
| 238,767 | Switzerland | Dec. 3, 1945 |